US007977734B2

(12) United States Patent
Jiang et al.

(10) Patent No.: US 7,977,734 B2
(45) Date of Patent: Jul. 12, 2011

(54) SONOS FLASH MEMORY

(75) Inventors: Haitao Jiang, Shanghai (CN); Xinsheng Zhong, Shanghai (CN); Jiangpeng Xue, Shanghai (CN); Gangning Wang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 23 days.

(21) Appl. No.: 12/502,778

(22) Filed: Jul. 14, 2009

(65) Prior Publication Data

US 2009/0273020 A1 Nov. 5, 2009

Related U.S. Application Data

(62) Division of application No. 11/840,984, filed on Aug. 19, 2007, now Pat. No. 7,648,882.

(30) Foreign Application Priority Data

Dec. 8, 2006 (CN) .......................... 2006 1 0119354

(51) Int. Cl.
*H01L 29/792* (2006.01)
(52) U.S. Cl. ................................ 257/324; 257/E29.309
(58) Field of Classification Search .................. 257/324, 257/E29.309, 325, 326
See application file for complete search history.

(56) References Cited

U.S. PATENT DOCUMENTS

| 6,900,098 | B1* | 5/2005 | Ogura et al. ................... 438/257 |
| 7,046,556 | B2* | 5/2006 | Ogura et al. ............. 365/185.28 |
| 7,119,395 | B2* | 10/2006 | Gutsche et al. ............... 257/321 |
| 7,170,132 | B2* | 1/2007 | Ogura et al. .................. 257/324 |
| 7,227,255 | B2* | 6/2007 | Nomoto et al. ............... 257/692 |
| 7,359,250 | B2* | 4/2008 | Ogura et al. ............. 365/185.28 |
| 7,382,659 | B2* | 6/2008 | Ogura et al. ............. 365/185.28 |
| 7,382,662 | B2* | 6/2008 | Ogura et al. ............. 365/185.29 |
| 7,391,653 | B2* | 6/2008 | Ogura et al. ............. 365/185.28 |
| 7,394,703 | B2* | 7/2008 | Ogura et al. ............. 365/185.29 |
| 2003/0025147 | A1* | 2/2003 | Nomoto et al. ............... 257/314 |
| 2006/0151821 | A1* | 7/2006 | Melik-Martirosian et al. ............................. 257/298 |
| 2007/0114597 | A1* | 5/2007 | Ogura et al. .................. 257/324 |
| 2008/0042191 | A1* | 2/2008 | Lin et al. ....................... 257/324 |

* cited by examiner

*Primary Examiner* — Anh Phung
*Assistant Examiner* — Michael Lulis
(74) *Attorney, Agent, or Firm* — Squire, Sanders & Dempsey (US) LLP (57) ABSTRACT

A method for fabricating a silicon-oxide-nitride-oxide-silicon (SONOS) flash memory, comprising: preparing a silicon substrate including a silicon oxide-silicon nitride-silicon oxide (ONO) layer, a first polysilicon layer and a first etch stop layer in sequence; etching the first etch stop layer along a direction of bit line; selectively etching the first polysilicon layer with the first etch stop layer as a mask, till the silicon oxide-silicon nitride-silicon oxide (ONO) layer is exposed, the etched first polysilicon layer having an inverse trapezia section along a direction of word line; filling a dielectric layer between portions of the first polysilicon layer, the dielectric layer having a trapezia section along the direction of word line. After the above steps, it becomes easy to remove the portion of the first polysilicon layer on a sidewall of the dielectric layer by vertical etching. Thus, no polysilicon residue will be formed on the sidewall of the dielectric layer. Thereby, the short circuit between different memory cells may be avoided.

1 Claim, 8 Drawing Sheets

SONOS FLASH MEMORY

CROSS-REFERENCES TO RELATED APPLICATIONS

This application is a divisional of prior application Ser. No. 11/840,984, filed Aug. 19, 2007, the entire disclosure of which is hereby incorporated by reference.

FIELD OF THE INVENTION

The present invention relates to a method for fabricating semiconductor device, and in particular to a silicon-oxide-nitride-oxide-silicon (SONOS) flash memory and a method for fabricating the same.

BACKGROUND OF THE INVENTION

In general, semiconductor memories for storing data may be classified into two types, i.e., nonvolatile memory and volatile memory. The volatile memory is prone to lose data stored therein when its power supply is interrupted, while the nonvolatile memory may retain information stored therein even when its power supply is off. Compared with other nonvolatile memory technology (such as a magnetic disk drive), the nonvolatile semiconductor memory has the advantages of low cost and high density. Consequently, the nonvolatile memory has been widely applied in many fields including the embedded system such as a personal computer (PC) and its peripherals, a telecom exchange, a cell phone, a network interconnection device, an instrument and an automobile device; and the newly emerged product for storing voice, image and data, such as a digital camera, a digital recorder and a personal digital assistant.

Recently, a nonvolatile memory with a SONOS (silicon-oxide-nitride-oxide-silicon) structure, i.e. SONOS flash memory has been introduced. The nonvolatile memory with a SONOS structure has a very thin cell, so that it is easy to be fabricated and easy to be integrated into, for example, a peripheral region and/or a logic region of integrated circuit.

Figure 1A:
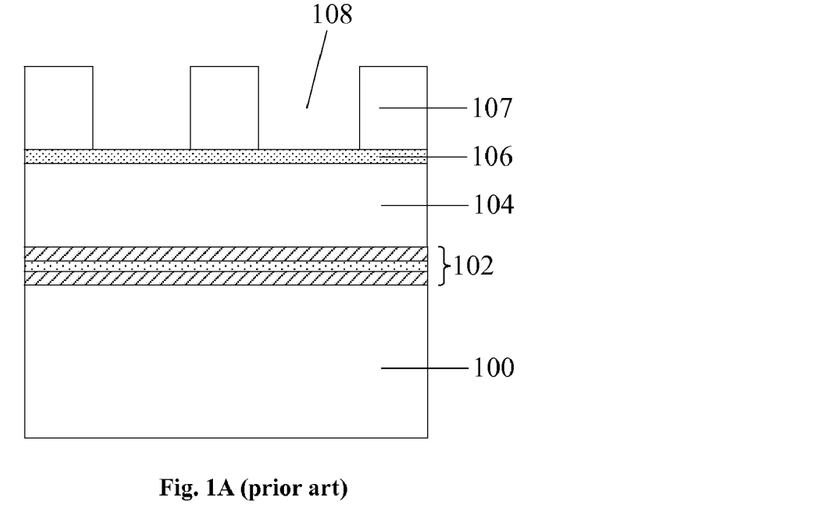
FIGS. 1A-1E are sectional diagrams illustrating different steps in a process for fabricating a SONOS flash memory in the prior art.

A method for fabricating a SONOS flash memory has been disclosed in U.S. Pat. No. 6,797,565, which comprises the steps as shown in FIG. 1A: first, a silicon oxide-silicon nitride-silicon oxide (ONO) layer 102 is formed over a silicon substrate 100; then a first polysilicon layer 104 is deposited over the ONO layer 102; a first etch stop layer 106 is formed over the first polysilicon layer 104; a first photoresist layer 107 is spin coated over the first polysilicon layer 106; and a first opening pattern 108 is formed on the first photoresist layer 107 along the direction of bit line through a exposure and development process, the position of the first opening pattern 108 on the first photoresist layer 107 corresponds to the position where the source and drain will be formed.

Figure 1B:
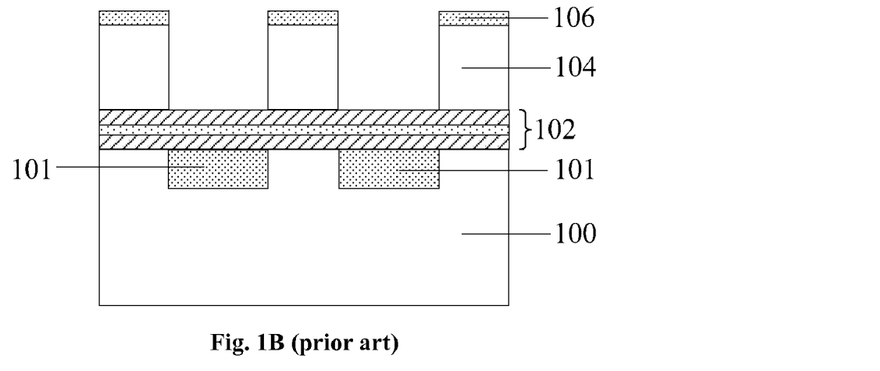

As shown in FIG. 1B, the first etch stop layer 106 and the first polysilicon layer 104 are dry etched by using the first photoresist layer 107 as a mask, till the ONO layer 102 is exposed. Since a selective etching is not adopted, the etched first etch stop layer 106 and the etched first polysilicon layer 104 have a rectangle section along the direction of word line. The etched first polysilicon layer 104 is used as the gate. Then, the first photoresist layer 107 is removed. An ion implantation is performed to the silicon substrate 100 through the ONO layer 102 by using the gate as a mask, to form the source/drain 101.

Figure 1C:
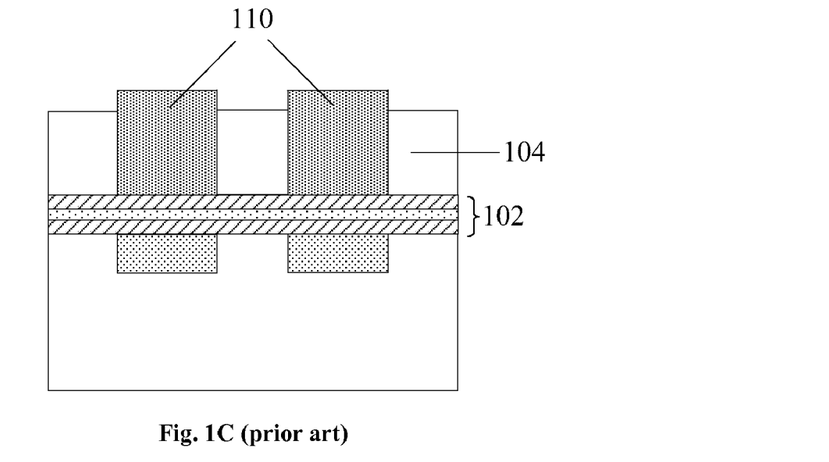

As shown in FIG. 1C, a dielectric layer 110 is deposited over the ONO layer 102 and the first etch stop layer 106. The material of the dielectric layer 110 is a low temperature silicon oxide, wherein the low temperature ranges from 200° C. to 500° C. Then, a planarization process is performed to the dielectric layer 110 till the first etch stop layer 106 is exposed. Next, the first etch stop layer 106 is removed to expose the first polysilicon layer 104.

Figure 1D:
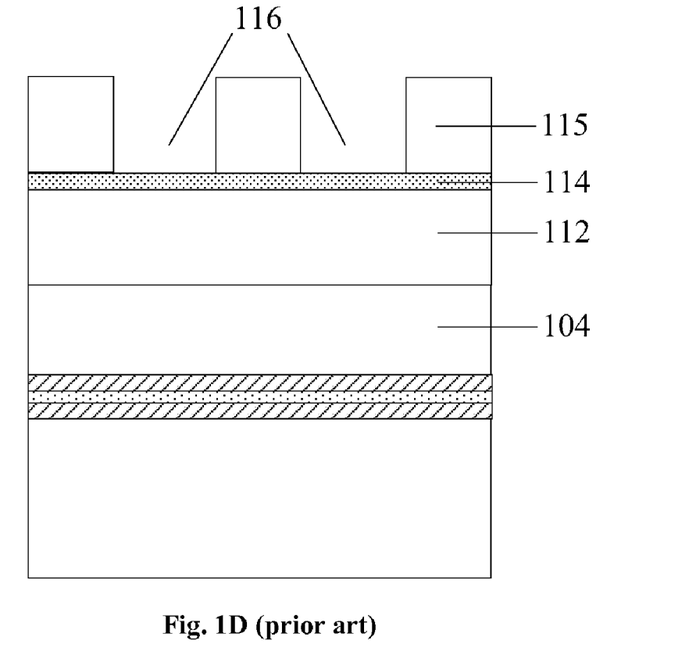

As shown in FIG. 1D, a second polysilicon layer 112 is deposited over the first polysilicon layer 104; a second etch stop layer 114 is deposited over the second polysilicon layer 112; and a second photoresist layer 115 is spin coated over the second etch stop layer 114; and then a second opening pattern 116 is formed on the second photoresist layer 115 along the direction of word line by a exposure and a development process.

Figure 1E:
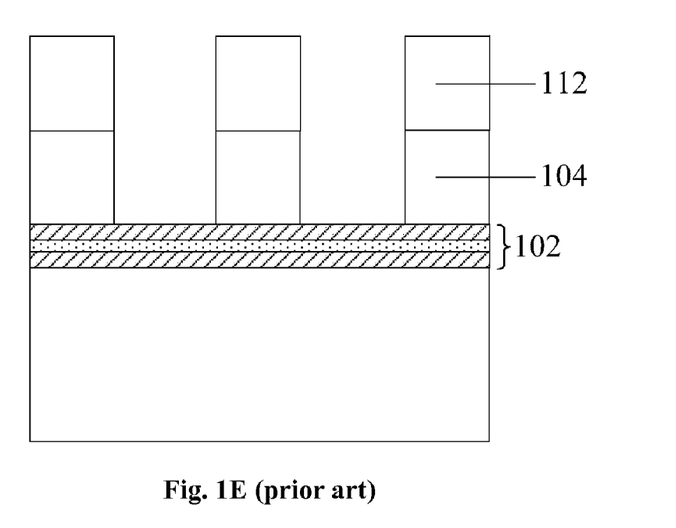

As shown in FIG. 1E, the second etch stop layer 114, the second polysilicon layer 112 and the first polysilicon layer 104 are dry etched along the second opening pattern 116 by using the second photoresist layer 115 as a mask, till the ONO layer 112 is exposed; and the second photoresist layer 115 and the second etch stop layer 114 are removed to expose the second polysilicon layer 112, which connects the gates of the SONOS flash memory to form a word line.

Figure 2:
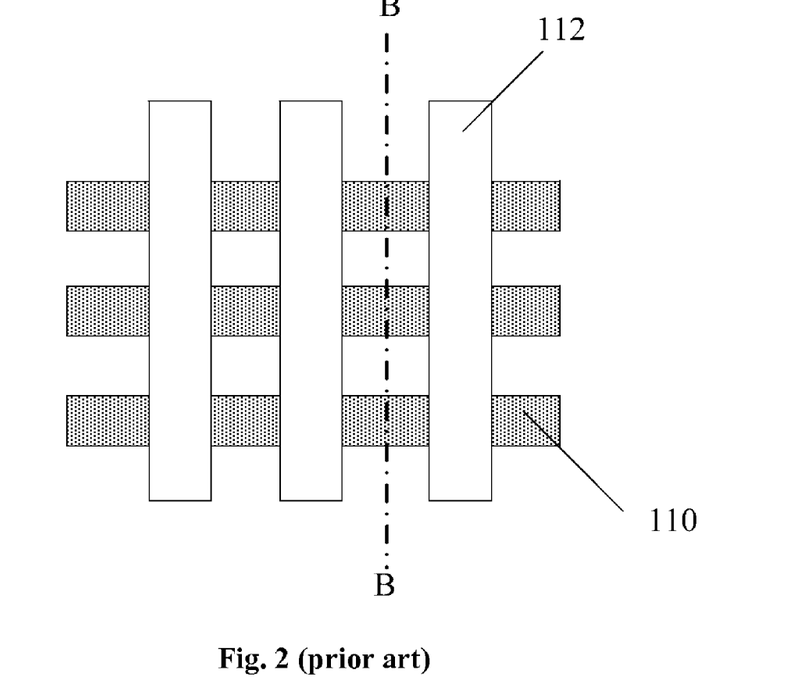
FIG. 2 is a top view illustrating a SONOS flash memory fabricated according to the prior art.
Figure 2A:
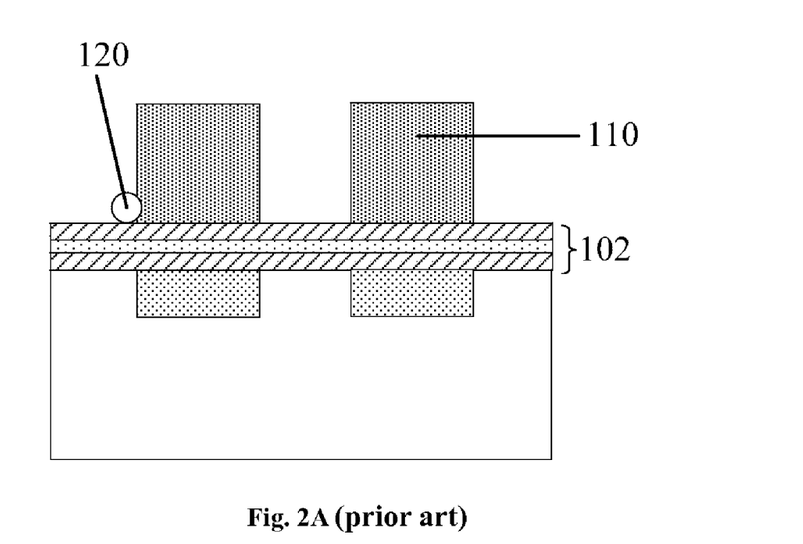
FIG. 2A is a sectional diagram of the SONOS flash memory shown in FIG. 2 taken along a line B-B in FIG. 2.

FIG. 2 is a top view of a SONOS flash memory fabricated according to the prior art, wherein the reference numeral 110 represents a dielectric layer and 112 represents the second polysilicon layer. FIG. 2A is a sectional diagram of the SONOS flash memory shown in FIG. 2 taken along the line B-B in FIG. 2. The line B-B shows the direction of word line. With reference to FIGS. 1A-1E and FIG. 2A, it may seen that the dielectric layer 110 deposited between the portions of the first polysilicon layer 104 has a rectangle section along the direction of word line, since the first polysilicon layer 104 has a rectangle section along the direction of word line after the first etch stop layer 106 and the first polysilicon layer 104 are etched. The dry etching is an anisotropy etching, that is, the etching functions mainly in the vertical direction and has little effect in the lateral direction. Thus, the portion of the first polysilicon layer 104 at the edge of the dielectric layer 110 may be absorbed by the dielectric layer 110 when the second etch stop layer 114, the second polysilicon layer 112 and the first polysilicon layer 104 are etched to a depth near the ONO layer 102. In this way, the first polysilicon layer 104 on the sidewall of the dielectric layer 110 can hardly be etched away by the weak lateral etching, while the vertical etching has little effect on the sidewall of the dielectric layer 110 either. Accordingly a polysilicon residue 120 will be formed on the sidewall of the dielectric layer 110, which may cause a short circuit between the memory cells.

In the method of fabricating SONOS flash memory according to the prior art, since the dielectric layer between the portions of the first polysilicon layer has a rectangle section along the direction of word line, and the dry etching is an anisotropy etching, that is, the etching functions mainly in the vertical direction and has little effect in the lateral direction, the portion of the first polysilicon layer at the edge of the dielectric layer may be absorbed by the dielectric layer when the second etch stop layer, the second polysilicon layer and the first polysilicon layer are etched to a depth near the ONO layer. In this way, the first polysilicon layer on the sidewall of the dielectric layer can hardly be etched away by the weak lateral etching, while the vertical etching has little effect on the sidewall of the dielectric layer either. Accordingly, the polysilicon residue will be formed on the sidewall of the dielectric layer, which may cause a short circuit between the memory cells.

SUMMARY OF THE INVENTION

The embodiments of present invention provide a method for fabricating silicon-oxide-nitride-oxide-silicon (SONOS)

flash memory which may prevent polysilicon residue from being formed on the sidewall of a dielectric layer.

An embodiment of the present invention provides a method for fabricating a silicon-oxide-nitride-oxide-silicon (SONOS) flash memory, comprising: preparing a silicon substrate including a silicon oxide-silicon nitride-silicon oxide (ONO) layer, a first polysilicon layer and a first etch stop layer in sequence; etching the first etch stop layer along a direction of bit line; selectively etching the first polysilicon layer with the first etch stop layer as a mask, till the silicon oxide-silicon nitride-silicon oxide (ONO) layer is exposed, the etched first polysilicon layer having an inverse trapezia section along a direction of word line; filling a dielectric layer between portions of the first polysilicon layer, the dielectric layer having a trapezia section along the direction of word line; removing the first etch stop layer; sequentially forming a second polysilicon layer and a second etch stop layer on the surface of the first polysilicon layer and the dielectric layer; etching the second etch stop layer, the second polysilicon layer and the first polysilicon layer along the direction of word line till the silicon oxide-silicon nitride-silicon oxide (ONO) layer is exposed; and removing the second etch stop layer.

Preferably, the step of selectively etching the first polysilicon layer may be divided into at least two dry etching stages.

Preferably, the step of selectively etching the first polysilicon layer may be divided into a first dry etching stage and a second dry etching stage, wherein an etching pressure of the second dry etching stage is larger than that of the first dry etching stage.

Preferably, the step of selectively etching the first polysilicon layer may be divided into a first dry etching stage, a second dry etching stage, and a third dry etching stage, wherein etching pressure of the first dry etching stage, the second dry etching stage and the third etching stage increases in order.

Preferably, the etching pressure of the first etching stage ranges from 15 to 25 mmHg, the etching pressure of the second etching stage ranges from 45 to 55 mmHg, and the etching pressure of the third etching stage ranges from 75 to 85 mmHg.

Preferably, the etching gas used in the first dry etching stage, the second dry etching stage and the third etching stage contains HBr and $HeO_2$. The mole ratio of the etching gas $HBr/HeO_2$ ranges from 15 to 20 and the etching time ranges from 35 s to 45 s in the first etching stage, the mole ratio of the etching gas $HBr/HeO_2$ ranges from 10 to 12 and the etching time ranges from 25 s to 35 s in the second etching stage, and the mole ratio of etching gas $HBr/HeO_2$ ranges from 10 to 12 and the etching time ranges from 55 s to 65 s in the third etching stage.

Preferably, an acute angle of the inverse trapezia or the trapezia ranges from 85° to 88°.

Another embodiment of the present invention provides also a SONOS flash memory, comprising: a silicon substrate; a silicon oxide-silicon nitride-silicon oxide (ONO) layer over the silicon substrate; a polysilicon layer over the silicon oxide-silicon nitride-silicon oxide (ONO) layer, the polysilicon layer including a first polysilicon layer and a second polysilicon layer over the first polysilicon layer; and a dielectric layer between portions of the first polysilicon layer, wherein the first polysilicon layer has an inverse trapezia section along a direction of word line and the dielectric layer has a trapezia section along the direction of word line.

Preferably, an acute angle of the inverse trapezia or the trapezia ranges from 85° to 88°.

Compared with the prior art, there is an advantage in the embodiments of the present invention that: the first polysilicon layer is selectively etched so that the first polysilicon layer has an inverse trapezia section along the direction of word line, and the dielectric layer formed between the portions of the first polysilicon layer has a trapezia section along the direction of word line. During the process of etching the second polysilicon layer and the first polysilicon layer to form a word line, it will become easy to remove the portion of the first polysilicon layer on a sidewall of the dielectric layer by vertical etching because of the trapezia section of the dielectric layer along the direction of word line. Thus, no polysilicon residue will be formed on the sidewall of the dielectric layer, and thereby the short circuit between the different memory cells may be avoided.

DETAILED DESCRIPTION OF THE EMBODIMENTS

In the embodiments of the present invention, the first polysilicon layer is selectively etched so that the first polysilicon layer has a section of inverse trapezia along the direction of word line, accordingly, the dielectric layer formed between the portions of the first polysilicon layer has a trapezia section along the direction the word line. As a result, during the process of forming the word line by etching the second polysilicon layer and the first polysilicon layer, the portion of the first polysilicon layer on the sidewall of the dielectric layer may be removed easily by the vertical etching because of the trapezia section of the dielectric layer along the direction of word line. Therefore, no polysilicon residue will be formed on the sidewall of the dielectric layer, and thereby the short circuit between the different memory cells may be avoided.

The above and other objects, features and advantages of the present invention will be better understood from the following detailed description taken in conjunction with the accompanying drawings.

A silicon-oxide-nitride-oxide-silicon (SONOS) flash memory according to an embodiment of the present invention comprises: a silicon substrate; a silicon oxide—silicon nitride—silicon oxide (ONO) layer over the silicon substrate; a polysilicon layer over the ONO layer, wherein the polysilicon layer includes a first polysilicon layer and a second polysilicon layer over the first polysilicon layer, the first polysilicon layer has an inverse trapezia section along the direction of word line; and a dielectric layer between the portions of the first polysilicon layer, wherein the dielectric layer has a trapezia section along the direction of word line.

Figure 3:
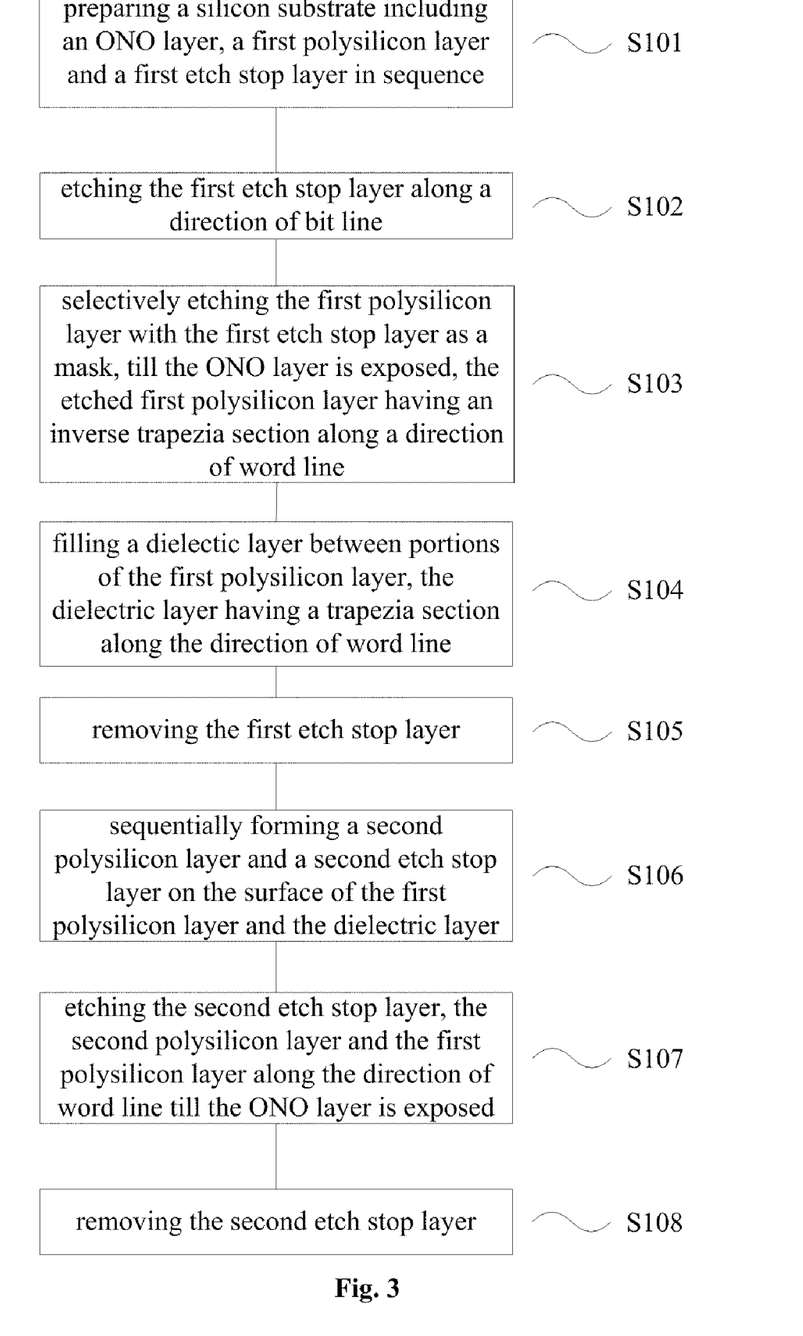
FIG. 3 is a flow chart illustrating the fabrication of a SONOS flash memory according to an embodiment of the present invention.

FIG. 3 is a flow chart illustrating for the process of forming a SONOS flash memory according to an embodiment of the present invention. As shown in FIG. 3, a silicon substrate, including an ONO layer, a first polysilicon layer and a first etch stop layer in sequence, is prepared at step S101; the first etch stop layer is etched along the direction of bit line at step S102; at step S103, the first polysilicon layer is selectively etched with the first etch stop layer as a mask till the ONO layer is exposed, wherein the etched first polysilicon layer has an inverse trapezia section along the direction of word line; a dielectric layer is filled between the portions of the first polysilicon layer at step S104, wherein the dielectric layer has a trapezia section along the direction of word line; the first etch stop layer is removed at step S105; a second polysilicon layer and a second etch stop layer is formed sequentially over the surface of the first polysilicon layer and the dielectric layer at step S106; then at step S107, the second etch stop layer, the second polysilicon layer and the first polysilicon layer are etched along the direction the word line till the ONO layer is exposed; and the second etch stop layer is removed at step S108.

Figure 4A:
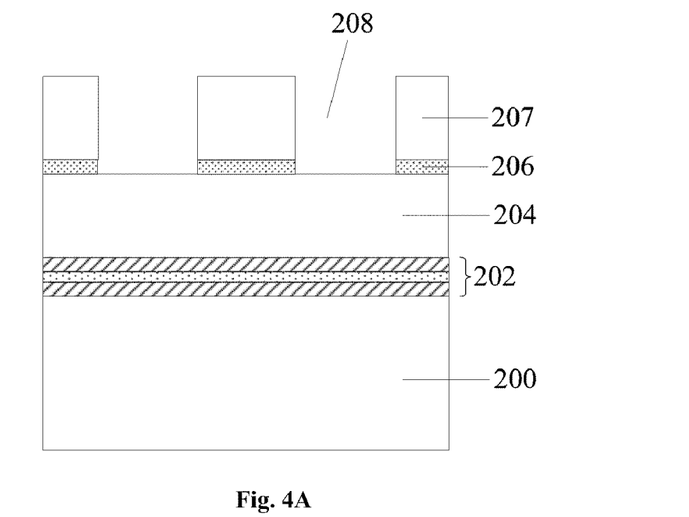
FIGS. 4A-4E are sectional diagrams illustrating different steps in a process for fabricating a SONOS flash memory according to an embodiment of the present invention.

FIGS. 4A-4E are sectional diagrams illustrating different steps in a process for fabricating a SONOS flash memory according to an embodiment of the present invention. As shown in FIG. 4A which is a sectional diagram along the direction of word line, a silicon oxide-silicon nitride-silicon oxide (ONO) 202 is formed over the silicon substrate 200 first. Then a first polysilicon layer 204 is deposited over the ONO layer 202 by a Chemical Vapor Deposition (CVD) process. A first etch stop layer 206 is deposited over the first polysilicon layer 204 by a CVD process. A first photoresisit layer 207 is spin coated over the first etch stop layer 206, and a first opening pattern 208 is formed on the first photoresist layer 207 along the direction of bit line through a exposure and development process, wherein the position of the first opening pattern 208 on the first photoresist layer 207 corresponds to the position where the source and drain will be formed. The first etch stop layer 206 is etched via the first opening pattern 208 with the first photoresist layer 207 as a mask.

In an embodiment of the invention, the method for forming the ONO layer 202 is a method according the prior art, which may be an oxidation method alternatively, instead of the CVD method mentioned above. In the silicon oxide-silicon nitride-silicon oxide (ONO) layer over the silicon substrate 200, the thickness of the first silicon oxide layer ranges from 30 Å to 50 Å, for example, 30 Å, 35 Å, 40 Å, 45 Å or 50 Å; the thickness of the silicon nitride layer ranges from 50 Å to 70 Å, for example, 50 Å, 55 Å, 60 Å, 65 Å or 70 Å; and the thickness of the second silicon oxide layer over the silicon nitride layer ranges from 100 Å to 140 Å, for example, 100 Å, 110 Å, 120 Å, 130 Å or 140 Å.

The thickness of the first polysilicon layer 204 ranges from 650 Å to 750 Å, for example, 650 Å, 680 Å, 700 Å, 720 Å or 750 Å.

The first etch stop layer 206 may be made of silicon nitride, silicon oxynitride, silicon carbide or the like, and has a thickness ranging from 300 Å to 400 Å, for example, 300 Å, 350 Å or 400 Å.

Figure 4B:
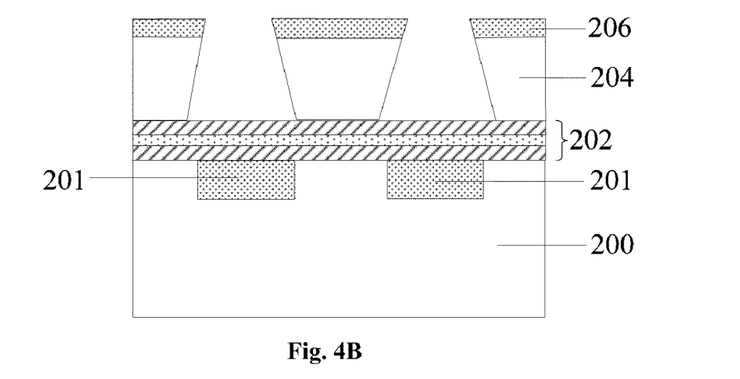

As shown in FIG. 4B which is a sectional diagram along the direction of word line, the first photoresist layer 207 is removed by an ashing and wet etching process. The first polysilicon layer 204 is selectively etched by a dry etching process with the first etch stop layer 206 as a mask, till the ONO layer 202 is exposed, the etched first polysilicon layer 204 is used as a gate and has an inverse trapezia section along the direction of word line. An ion implantation is performed to the silicon substrate 200 through the ONO layer 202 with the gate as a mask to a certain depth, so as to form the source/drain 201.

In an embodiment of the invention, a mixture of gases of HBr and HeO$_2$ is used to perform the dry etching, and the selectively etching process may be divided into three stages, wherein the etching pressure in the first stage ranges from 15 to 25 mmHg, the etching pressure in the second stage ranges from 45 to 55 mmHg, and the etching pressure in the third stage ranges from 75 to 85 mmHg. The plasma in the etching apparatus and the gas for lateral etching sinks with the continuous increasing of the etching pressure, so that the etching amount along the depth of the first polysilicon layer 204 increases gradually. However, the sidewall of the etched first polysilicon layer 204 is not flat enough by only the control of the etching pressure. Hence, it is necessary to control the etching pressure, the mole ratio of the etching gases and the etching time at the same time. Wherein, in the first stage of the etching, the etching pressure ranges from 15 to 25 mmHg, the mole ratio of HBr/HeO$_2$ ranges from 15 to 20, and etching time ranges from 35 to 45 s, a first polysilicon layer 204 having a rectangle section along the direction of word line is formed; in the second stage of the etching, the etching pressure ranges from 45 to 55 mmHg, the mole ratio of HBr/HeO$_2$ ranges from 10 to 12, and etching time ranges from 25 to 35 s, a first polysilicon layer 204 having an inverse trapezia section along the direction of word line and a flat sidewall is formed, an acute angle of the inverse trapezia ranging from 88° to 89°; in the third stage of the etching, the etching pressure ranges from 75 to 85 mmHg, the mole ratio of HBr/HeO$_2$ ranges from 10 to 12, and etching time ranges from 55 to 65 s, a first polysilicon layer 204 having an inverse trapezia section along the direction of word line and a flat sidewall is formed, the acute angle of the inverse trapezia ranging from 85° to 88°.

The depth of the ion implantation is known in the prior art, and the energy and the dose of the ion implantation may be adjusted according to the desired depth of the implantation. In an embodiment of the invention, the dose of the implanted ions ranges from 1.0E15/cm$^2$ to 2.0E15/cm$^2$, for example, 1.0E15/cm$^2$, 1.5E15/cm$^2$ or 2.0E15/cm$^2$; and the energy for the ion implantation ranges from 15 KeV to 25 KeV, for example, 15 KeV, 20 KeV or 25 KeV.

A thermal anneal process may be performed after the ion implantation so as to diffuse the implanted ions better, that is, to increase the depth of the ions implanted into the silicon substrate 200.

Figure 4C:
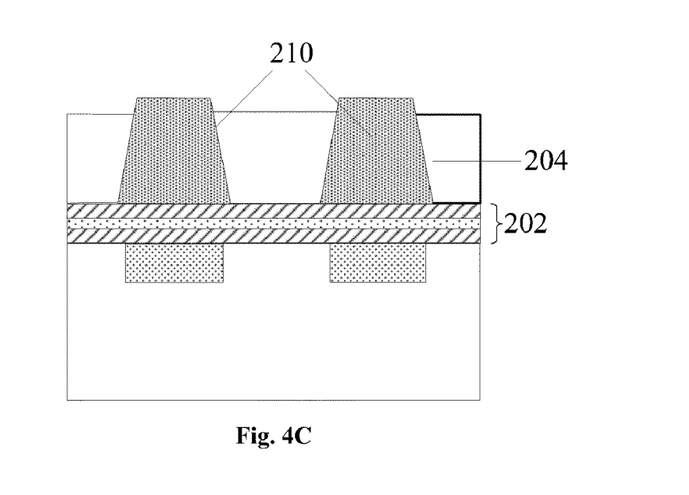

As shown in FIG. 4C which is a sectional diagram along the direction of word line, a dielectric layer 210 is deposited over the ONO layer 202 and the first etch stop layer 206 by a CVD process. Then the dielectric layer 210 is planarized by a Chemical Mechanical Polishing (CMP) process till the surface of the first etch stop layer 206 is completely exposed, wherein the planarized dielectric layer 210 has a trapezia section along the direction of word line. The first etch stop layer 206 is removed by a wet etching process till the first polysilicon layer 204 is exposed.

Wherein, the dielectric layer 210 is made of silicon oxide, silicon oxynitride or the like. Preferably, the dielectric layer 210 is made of low temperature silicon oxide by a Plasma Enhanced Chemical Vapor Deposition (PECVD) process, in which the low temperature ranges from 200° C. to 500° C.

Figure 4D:
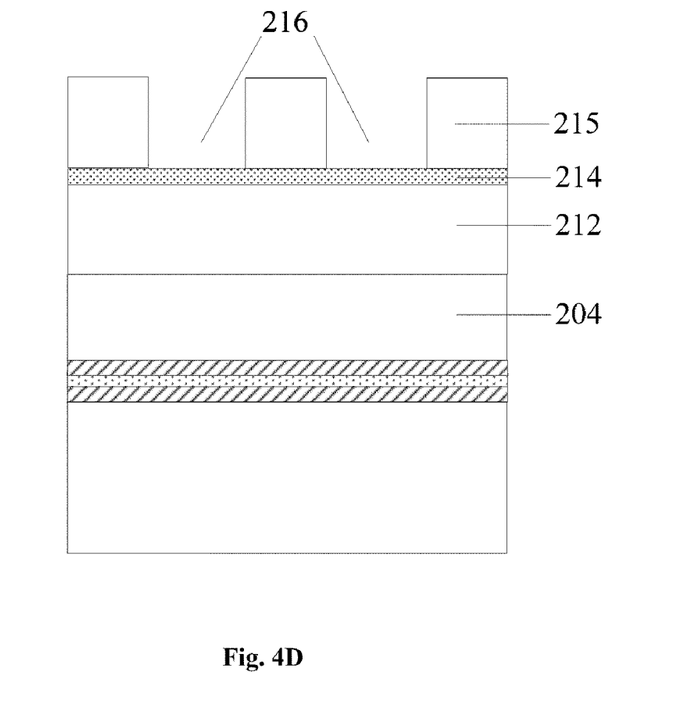

As shown in FIG. 4D which is a sectional diagram along the direction of word line, a second polysilicon layer 212 is deposited over the first polysilicon layer 204 and the dielectric layer 210 by a CVD process; a second etch stop layer 214 is deposited over the second polysilicon layer 212 by a CVD process; and a second photoresist layer 215 is spin coated over the second etch stop layer 214 and a second opening pattern 216 is formed on the second photoresist layer 215 along the direction of word line through a exposure and a development process.

In an embodiment of the present invention, the thickness of the second polysilicon layer 212 ranges from 1100 Å to 1300 Å, for example, 1100 Å, 1200 Å or 1300 Å.

The second etch stop layer 214 is made of silicon nitride, silicon oxynitride, silicon carbide or the like, and has a thickness ranging from 250 Å to 350 Å, for example, 250 Å, 300 Å or 350 Å.

Figure 4E:
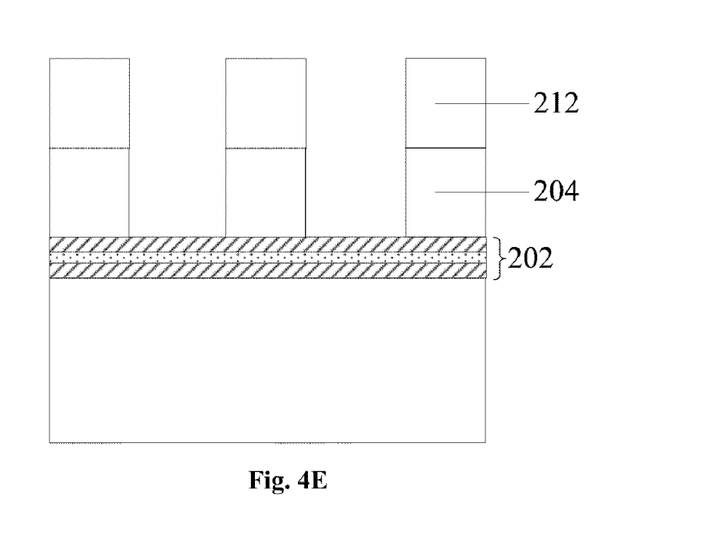

As shown in FIG. 4E which is a sectional diagram along the direction of word line, the second etch stop layer 214, the second polysilicon layer 212 and the first polysilicon layer 204 are dry etched with the second photoresist layer 215 as a mask, till the ONO layer 202 is exposed; and the second photoresist layer 215 and the second etch stop layer 214 are removed by an ashing and wet etching process till the second polysilicon layer 212 is exposed. The second polysilicon layer 212 connects the gates in the SONOS flash memory to form a word line.

In an embodiment of the invention, a mixture of gases of HBr and $HeO_2$ is utilized to etch the second etch stop layer 214, the second polysilicon layer 212 and the first polysilicon layer 204. The mole ratio of $HBr/HeO_2$ ranges from 30 to 40, for example, 30, 32, 35, 38 or 40. The etching time ranges from 150 s to 170 s, for example, 150 s, 160 s, or 170 s.

Next, referring to FIG. 4A-4E again, a preferred embodiment of the invention is shown below. As shown in FIG. 4A, an ONO layer 202 is formed over a P-type silicon substrate 200 first, wherein the thickness of the first silicon oxide layer over the silicon substrate 200 is 40 Å, the thickness of nitride layer is 60 Å, and the thickness of the second silicon oxide layer over the second silicon nitride layer is 120 Å. Then a first polysilicon layer 204 with a thickness of 700 Å is deposited over the ONO layer 202 by a CVD process. A first etch stop layer 206 is deposited over the first polysilicon layer 204 by a CVD process, wherein the first etch stop layer 206 has a thickness of 400 Å and is made of silicon oxide. A first photoresisit layer 207 is spin coated over the first etch stop layer 206 and a first opening pattern 208 is formed on the first photoresist layer 207 along the direction of bit line through a exposure and development process, wherein the position of the first opening pattern 208 on the first photoresist layer 207 corresponds to the position where the source and drain will be formed in the silicon substrate 200. The first etch stop layer 206 is etched through the first opening pattern 208 with the first photoresist layer 207 as a mask.

As shown in FIG. 4B, the first photoresist layer 207 is removed by an ashing and wet etching process. The first polysilicon layer 204 is etched for 35 second at a etching pressure of 15 mmHg and a mole ratio of $HBr/HeO_2$ of 15, with the first etch stop layer 206 as a mask, till the ONO layer 202 is exposed, so that the first polysilicon layer 204 is formed to have a rectangle section along the direction of word line. Next, the first polysilicon layer 204 is etched continuously for 25 second at a etching pressure of 45 mmHg and a mole ratio of $HBr/HeO_2$ of 10, so that the first polysilicon layer 204 is formed to have an inverse trapezia section along the direction of word line and a flat sidewall, wherein an acute angle of the inverse trapezia ranges from 88° to 89°. Finally, the first polysilicon layer 204 is etched continuously for 55 second at a etching pressure of 75 mmHg and a mole ratio of $HBr/HeO_2$ of 10, so that the first polysilicon layer 204 is formed to have an inverse trapezia section along the direction of word line and a flat sidewall, wherein an acute angle of the inverse trapezia ranges from 85° to 88°. The first photoresist layer 207 is removed by an ashing and wet etching process. Phosphor ions with a dose of 1.5E15/cm2 and energy of 20 KeV are implanted into the silicon substrate 200 through the ONO layer 202 with the gate as a mask to form the source/drain 201.

As shown in FIG. 4C, a dielectric layer 210 is deposited over the ONO layer 202 and the first etch stop layer 206 by a PECVD (Plasma Enhanced Chemical Vapor Deposition) process, wherein the dielectric layer 210 is made of low temperature silicon oxide, the low temperature ranges from 200° C. to 500° C. Then the dielectric layer 210 is planarized by a CMP (Chemical Mechanic Polishing) process till the surface of the first etch stop layer 206 is completely exposed, wherein the planarized dielectric layer 210 has a trapezia section along the direction of word line. The first etch stop layer 206 is removed by a wet etching process till the first polysilicon layer 204 is exposed.

As shown in FIG. 4D, a second polysilicon layer 212 with a thickness of 1200 Å is deposited over the first polysilicon layer 204 and the dielectric layer 210 by a CVD process. A second etch stop layer 214 is deposited over the second polysilicon layer 212 by a CVD process, wherein the second etch stop layer 214 is made of silicon nitride and has a thickness of 300 Å. A second photoresist layer 215 is spin coated over the second etch stop layer 214 and a second opening pattern 216 is formed on the second photoresist layer 215 along the direction of word line through a exposure and development process.

As shown in FIG. 4E, the second etch stop layer 214, the second polysilicon layer 212 and the first polysilicon layer 204 are dry etched with the second photoresist layer 215 as a mask, till the ONO layer 202 is exposed, wherein the gas for etching contains HBr and $HeO_2$, the mole ratio of HBr/HeO2 is 30 and the etching time is 15 s. The second photoresist layer 215 and the second etch stop layer 214 are removed by an ashing and wet etching process till the second polysilicon layer 212 is exposed. The second polysilicon layer 212 connects the gates in the SONOS flash memory to form a word line.

Referring to the FIG. 4A-4E again, a SONOS flash memory according to an embodiment of the invention includes: a silicon substrate 200; an ONO layer 202 over the silicon substrate 200; a polysilicon layer over the ONO layer 202, wherein the polysilicon layer includes a first polysilicon layer 204 and a second polysilicon layer 212 over the first polysilicon layer 204, the first polysilicon layer 204 has an inverse trapezia section along the direction of word line and is used as a gate; a source/drain 201 formed in the silicon substrate 200 at the two sides of the gate; and a dielectric layer 210 between the portions of the first polysilicon layer 204, wherein the dielectric layer has a trapezia section along the direction of word line.

Figure 5:
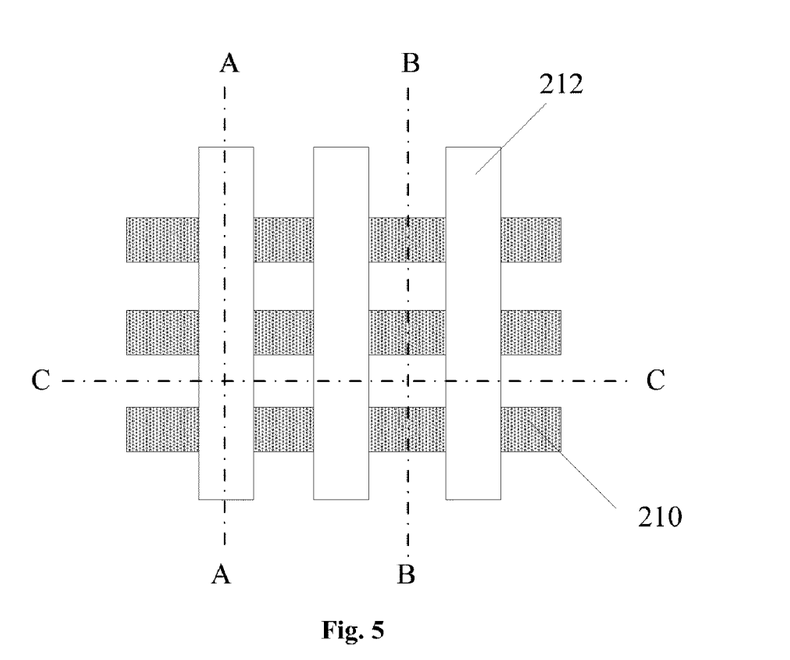
FIG. 5 is a top view illustrating a SONOS flash memory according to an embodiment of the present invention.
Figure 5A:
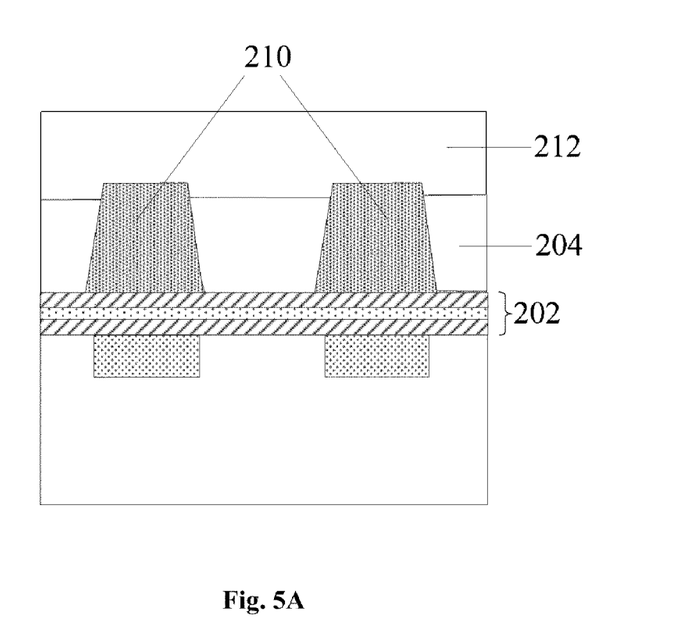
FIGS. 5A-5C are sectional diagrams of the SONOS flash memory shown in FIGS. 4A-4E, taken along line A-A, B-B and C-C respectively.
Figure 5B:
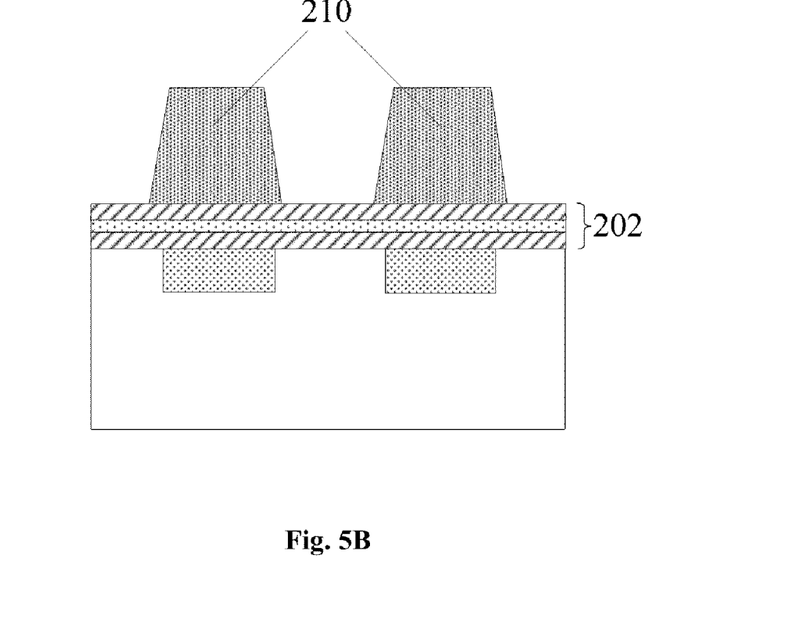
Figure 5C:
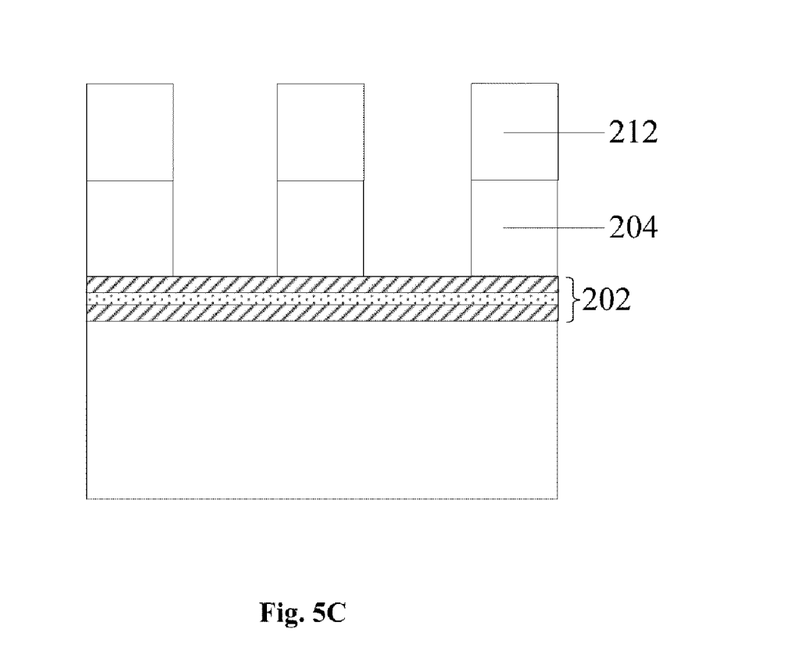

FIG. 5 is a top view illustrating a SONOS flash memory according to an embodiment of the invention, wherein the reference numeral 210 represents the dielectric layer and 212 represents the second polysilicon layer. FIGS. 5A-5C are sectional diagrams of the SONOS flash memory shown in FIG. 5, taken along lines A-A, B-B and C-C respectively, wherein the line C-C is the direction of bit line in the memory and the lines A-A and B-B are the direction of word line in the memory. As shown in FIG. 5A-5C, the first polysilicon layer 204 is etched for 35-45 second with a etching pressure ranging from 15 to 25 mmHg and a mole ratio of $HBr/HeO_2$ ranging from 15 to 20, till the ONO layer 202 is exposed, so that the polysilicon layer 204 is formed to have a rectangle section along the direction of word line. Then the first polysilicon layer 204 is continuously etched for 25-35 second with a etching pressure ranging from 45 to 55 mmHg and a mole ratio of HBr/HeO$_2$ ranging from 10 to 12, so that the first polysilicon layer 204 is formed to have an inverse trapezia section along the direction of word line and a flat sidewall, wherein an acute angle of the inverse trapezia ranging from 88° to 89°. Finally, the first polysilicon layer 204 is etched for 55-65 second with an etching pressure ranging from 75 to 85 mmHg and a mole ratio of HBr/HeO$_2$ ranging from 10 to 12, so that the first polysilicon layer 204 is formed to have an inverse trapezia section along the direction word line and a flat sidewall, wherein an acute angle of the inverse trapezia ranging from 85° to 88°. Then, the dielectric layer 210 having a trapezia section along the direction of word line is deposited between the portions of the first polysilicon layer 204. During the dry etching process for the second polysilicon layer 212 and the first polysilicon layer 204 after the first etch layer 206 is removed, it is easy to remove the portion of the first polysilicon layer 204 on the sidewall of the dielectric layer 210 by vertical etching since the dielectric layer 210 formed between the portions of the first polysilicon layer 204 has a trapezia section along the direction of word line. Thus, no polysilicon residue will be formed on the sidewall of the dielectric layer 210, and thereby the short circuit between the different memory cells may be avoided.

The present invention has been described and illustrated by the embodiments of the present invention and the drawings. It shall be recognized by those skilled in the art that those embodiments and drawings are merely illustrative and not restrictive, that the present invention shall not be limited thereto, and that various modifications and variations may be made thereto in light of the descriptions and the drawings without departing from the spirit and scope of the present invention as defined by the accompanying claims.

What is claimed is:

1. A silicon-oxide-nitride-oxide-silicon (SONOS) flash memory, comprising: a silicon substrate; a silicon oxide-silicon nitride-silicon oxide (ONO) layer over the silicon substrate; a polysilicon layer over the silicon oxide-silicon nitride-silicon oxide (ONO) layer, the polysilicon layer including a first polysilicon layer and a second polysilicon layer over the first polysilicon layer; and a dielectric layer between portions of the first polysilicon layer, wherein the first polysilicon layer has an inverse trapezia section along a direction of word line and the dielectric layer has a trapezia section along the direction of word line, and an acute angle of the inverse trapezia or the trapezia ranges from 85° to 88°.

* * * * *